Sept. 24, 1968 S. M. CORK ET AL 3,403,344
COMMUTATED LINEAR MULTIPLE GATE
Filed March 22, 1965
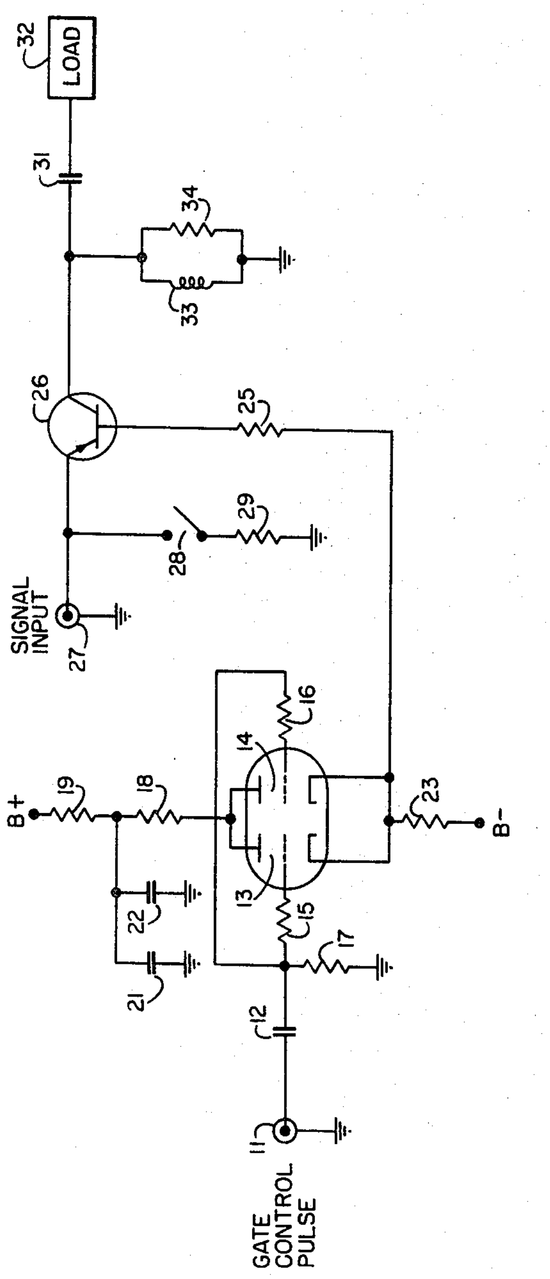
INVENTORS
SPENCER M. CORK
GAROLD K. JENSEN
JAMES E. McGEOGH
BY
ATTORNEY United States Patent Office 3,403,344
Patented Sept. 24, 1968

3,403,344

COMMUTATED LINEAR MULTIPLE GATE

Spencer M. Cork, Camp Springs, Md., Garold K. Jensen, Alexandria, Va., and James E. McGeogh, Silver Spring, Md., assignors to the United States of America as represented by the Secretary of the Navy Filed Mar. 22, 1965, Ser. No. 441,937
2 Claims. (Cl. 328—98)

ABSTRACT OF THE DISCLOSURE

An electronic transmission gate comprising a transistor which is switched between conditions of saturation and cutoff under the control of a cathode follower driver circuit. The cathode follower serves as a low output impedance driver as well as a source of bias voltage of one polarity to bias off the transistor and as a source of control voltage of the opposite polarity to place the transistor in saturation.

The invention described herein may be manufactured and used by or for the Government of the United States of America for governmental purposes without the payment of any royalties thereon or therefor.

The present invention relates to an electronic gate circuit and more particularly to an improved controlled gate circuit.

Prior art controlled gating circuits employ a driver or buffer circuit with a gate. These circuits have separate voltage sources for biasing the driver circuit and the gate control input. Frequently, different values of voltage bias are required for each of the circuits, especially where a vacuum tube driver circuit controls a transistor gate. Those concerned with the development of controlled switching circuits have long recognized the need for a circuit having a common voltage source for both the driver circuit and the gate and wherein the driver circuit is a low impedance device for driving large gating pulses. There was also a need for a controlled gating circuit having a high degree of linearity for passing continuous wave signals in the frequency range of 0.4 to 7.5 megacycles per second at a gating frequency of 180 cycles per second without distortion.

The general purpose of this invention is to provide a controlled gating circuit which embraces all the advantages of similarly employed circuits and possesses none of the aforesaid disadvantages. To attain this, the present invention contemplates a unique arrangement wherein a cathode-follower circuit serves as both a low output impedance driver and as a means for superimposing the gate control pulse upon a selected bias level to the base of a transistor gate. Parasitic suppressors are provided for the grid and plate of each of the triodes of the cathode-follower circuit. A unique biasing arrangement requires only a single voltage source for biasing both the cathodes of the cathode follower circuit and the base of the transistor gate. A filter circuit is also provided at the gate output for extending the frequency response and for passing only the signal input frequencies. An alternative return path is provided at the gate signal input for either relatively low or high impedance signal sources.

An object of the present invention is the provision of a new and improved controlled linear gate circuit having a wide dynamic range with an absence of distortion.

Another object is to provide an improved controlled gate circuit which requires but a single voltage source for biasing the cathode of a cathode-follower circuit and the base of a gating transistor.

A further object is to provide an improved controlled gate circuit having means at its output for passing only the input signal frequencies.

Still another object is to provide an improved controlled gating circuit wherein signals from either low or high impedance signal sources may be passed.

Other objects and many of the attendant advantages of this invention will be readily appreciated as the same becomes better understood by reference to the following detailed description when considered in connection with the accompanying drawing wherein:

The drawing is a circuit diagram of the controlled switching circuit of this invention.

Referring now to the drawing, there is shown a coaxial input 11 connected to a capacitor 12 which in turn is coupled to the control grid of triodes 13 and 14 by means of resistors 15 and 16, respectively. Grid resistor 17 is connected between ground and the common connection of resistors 15 and 16. The triodes 13 and 14 are connected in parallel to obtain a low output impedance. The plates of the triodes are connected together to a bias source through parasitic suppressor resistor 18 and dropping resistor 19. A pair of by-pass capacitors 21 and 22 are connected between resistors 18 and 19 to ground for filtering A.C. signals. The cathodes of triodes 13 and 14 are connected together to a voltage bias source through cathode load resistor 23. The cathodes of triodes 13 and 14 are also connected through limiting resistor 25 to the base of gating transistor 26 having its emitter connected to coaxial input 27 for receiving the continuous wave signal to be gated. A switch 28 may be closed to provide an alternative return path for use with high impedance signal sources. The collector of transistor 26 is connected through a D.C. blocking capacitor 31 to a utilization device or load 32. An inductor 33 and resistor 34 are connected in parallel across the collector of transistor 26 to provide a low impedance path for low frequencies, including the gating frequency, and a high impedance path to frequencies within the continuous wave input frequency range.

The values of grid resistor 17, limiting resistor 19, and cathode load resistor 23 are selected to provide a positive potential on the cathodes of triodes 13 and 14 under quiescent conditions to maintain transistor 26 in the non-conducting condition. Limiting resistor 25 is selected to provide the proper current bias to the base of transistor 26 during conduction of the transistor. Resistors 15 and 16 in the grid circuit of triodes 13 and 14, respectively, and resistor 18 in the common plate circuit, suppress parasitic oscillations of the tube. Resistors 15 and 16 are of the order of 100 ohms, while parasitic suppressor resistor 18 is of the order of 10 ohms.

The controlled gating circuit of this invention is capable of passing a continuous wave signal received at input 27 in the frequency range of 0.4 to 7.5 megacycles per second, while input 11 may receive gating pulses having a duration of 240 microseconds and a pulse repetition rate of 180 cycles per second. Only the 0.4 to 7.5 megacycle input signal is to be passed to a utilization or load circuit 32. The circuit at the output of the gating transistor 26 comprising inductor or coil 33 and resistor 34 together with the stray capacitance of coil 33, extends the high frequency response of the gating circuit and acts as a high impedance to all frequencies in the input signal frequency range. Coil 33 also prevents the collector of transistor 26 from being biased by any other voltage than approximately zero D.C.

In operation, the linear gate circuit of this invention allows the input signal at terminal 27 to be passed whenever a negative gate control pulse is present at input 11. When the input signal is being passed to the load, transistor 26 is saturated so that a very low collector-emitter impedance exists in the signal path. This low impedance helps to insure a wide dynamic linear range without distortion and also a low insertion loss since the collector-emitter impedance is significantly lower than the impedance of the RL circuit at the collector or the impedance of the load. Another important consideration for insuring a wide dynamic liinear range is that the value of resistor 25 and the gate control pulse amplitude are chosen so that the transistor remains saturated to pass the input signal regardless of the voltage level and polarity of the signal at input 27. The gate control pulse must be such that the amplitude of the input signal to the emitter of transistor 26 does not cause the transistor to depart from its fully saturated condition.

In the absence of the negative gating pulse at the base of transistor 26, the potential at the cathode of triodes 13 and 14 is maintained slightly positive with respect to ground thereby preventing transistor 26 from going into conduction. The quiescent bias voltage at the cathode must be such that transistor 26 can be maintained in a non-conducting condition regardless of the voltage level and polarity of the input signal at the emitter of transistor 26. When a negative gate control pulse is applied through input 11 to the control grids of triodes 13 and 14, the cathode potential follows the grid voltage and decreases to a point considerably negative with respect to ground thereby biasing PNP transistor 26 into conduction so that the signal at input 27 is passed to load 32.

In summary, the circuit of this invention provides a controlled gate for passing continuous wave signals linearly at a selected gating rate. The gate is linear in the sense that the gated output signal amplitude is directly proportional to the signal input at the time of gating. A gate control pulse is applied to the base of a transistor gate through a cathode-follower circuit which functions as a low impedance driver of large amplitude pulses. A single common voltage supply biases both the gate control input and the cathode circuit of the cathode follower.

Obviously many modifications and variations of the present invention are possible in the light of the above teachings. For example, a single triode, having suitable characteristics for providing the desired output impedance, could be employed in place of the triode pair 13 and 14 of the cathode-follower circuit. It is therefore to be understood, that within the scope of the appended claims, the invention may be practiced otherwise than as specifically described.

What is claimed and desired to be secured by Letters Patent of the United States is:

1. A controlled linear gating circuit for selectively passing continuous wave signals without distortion from a signal input terminal to a signal output terminal, said gating circuit comprising:

a transistor having a first electrode, a second electrode, and a base electrode and having a signal transmission path between said first electrode and said second electrode;

a source or reference potential;

an inductor in parallel with a resistor with the parallel combination having its first terminal connected to said second electrode and its second terminal connected to said reference potential to provide a low impedance path for low frequencies and maintain the D.C. level of said second electrode at substantially reference potential;

a capacitor whose first terminal is connected to said second electrode and whose second terminal is connected to said signal output terminal;

a source of fixed potential which is negative with respect to said reference potential;

a source of fixed potential which is positive with respect to said reference potential;

a pair of parallel connected cathode followers having a common plate resistor, a common cathode resistor, and a pair of input electrodes, said plate resistor being connected to said positive potential and said cathode resistor being connected to said negative potential;

a pair of parasitic suppression resistors each connected in series with a respective one of said input electrodes;

a limiting resistor whose first terminal is connected to the cathode side of said cathode resistor and whose second terminal is connected to said base electrode to move the potential of said base electrode in response signals from said cathode follower to potential values on opposite sides of said reference potential and place said transistor selectively into conditions of saturation and cutoff and allow the continuous wave signals to pass through said transmission path undistorted when said transistor is in its saturated region and prevent the signals from passing through said transmission path when said transistor is in its cutoff region.

2. A controlled linear gating circuit for selectively passing continuous wave signals without distortion from a signal input terminal to a signal output terminal, said gating circuit comprising:

a transistor having a first signal electrode, a second signal electrode, and a control electrode and having a signal transmission path between said first signal electrode and said second signal electrode;

a signal input terminal for receiving said continuous wave signals being connected to said first signal electrode;

a signal output terminal for delivering said continuous wave signals after they have passed through said transmission path;

a fixed ground reference potential;

an inductor whose first terminal is directly connected to one of said signal electrodes and whose second terminal is connected to said fixed ground reference potential;

a capacitor whose first terminal is connected to said second signal electrode and whose second terminal is connected to said signal output terminal;

a source of fixed potential which is negative with respect to said fixed ground reference potential;

a source of fixed potential which is positive with respect to said fixed ground reference potential;

a cathode follower having an input electrode, a plate resistor and a cathode resistor, said plate resistor being connected to said positive potential and said cathode resistor being connected to said negative potential;

a resistor whose first terminal is connected to the cathode of said cathode follower and whose second terminal is connected to said control electrode to swing the potential of said control electrode between points on opposite sides of said fixed ground reference potential to put said transistor into conditions of saturation and cutoff and allow the signal to pass through said transmission path undistorted when said transistor is in its saturated region and prevent the signal from passing through said transmission path when said transistor is in its cutoff region.

References Cited

UNITED STATES PATENTS

| | | | |
|---|---|---|---|
| 2,108,833 | 2/1938 | Wallace | 328—91 |
| 2,258,732 | 10/1941 | Blumlein et al. | 328—91 |
| 2,892,103 | 6/1959 | Scarbrough | 328—79 |
| 3,015,737 | 2/1962 | Harris et al. | 328—91 |
| 3,046,417 | 7/1962 | Garcia | 328—146 |
| 3,248,655 | 4/1966 | Kobbe et al. | 307—88.5 |

ARTHUR GAUSS, *Primary Examiner.*

H. DIXON, *Assistant Examiner.*